(12) United States Patent
Jansen (10) Patent No.: US 9,369,148 B2
(45) Date of Patent: Jun. 14, 2016

(54) CIRCUIT ARRANGEMENT, DEVICE AND METHOD FOR 5B/6B CODING

(71) Applicant: SILICON LINE GMBH, Munich (DE)

(72) Inventor: Florian Jansen, Munich (DE)

(73) Assignee: SILICON LINE GMBH, Munich (DE)

( * ) Notice: Subject to any disclaimer, the term of this patent is extended or adjusted under 35 U.S.C. 154(b) by 0 days.

(21) Appl. No.: 14/552,182

(22) Filed: Nov. 24, 2014

(65) Prior Publication Data

US 2015/0207520 A1 Jul. 23, 2015

Related U.S. Application Data

(63) Continuation of application No. PCT/DE2013/200017, filed on May 27, 2013.

(30) Foreign Application Priority Data

May 25, 2012 (DE) .......................... 10 2012 104 573

(51) Int. Cl.
| | |
|---|---|
| *H03M 5/00* | (2006.01) |
| *H03M 5/14* | (2006.01) |
| *H04L 25/49* | (2006.01) |
| *H03K 19/20* | (2006.01) |

(52) U.S. Cl.
CPC .............. *H03M 5/145* (2013.01); *H03K 19/20* (2013.01); *H04L 25/4908* (2013.01)

(58) Field of Classification Search
CPC ................................ H03M 5/145; H03K 19/20
USPC .............. 341/58, 84; 708/160; 716/4; 326/40
See application file for complete search history.

(56) References Cited

U.S. PATENT DOCUMENTS

| | | | | |
|---|---|---|---|---|
| 6,654,565 | B2 * | 11/2003 | Kenny ............................ | 398/182 |
| 2004/0083419 | A1 * | 4/2004 | Chiba et al. .................... | 714/799 |
| 2004/0233075 | A1 | 11/2004 | Park et al. | |
| 2006/0143257 | A1 * | 6/2006 | Grinchuk ...................... | 708/160 |
| 2007/0165698 | A1 * | 7/2007 | Haque et al. .................. | 375/141 |
| 2009/0037853 | A1 * | 2/2009 | Sotiriou et al. ................. | 716/4 |
| 2009/0167348 | A1 * | 7/2009 | Dorairaj .......................... | 326/40 |
| 2009/0315743 | A1 * | 12/2009 | Huang et al. ................. | 341/106 |

FOREIGN PATENT DOCUMENTS

EP 0294614 A2 12/1988

OTHER PUBLICATIONS

International Search Report; PCT/DE2013/200017; Nov. 13, 2013.
A.Widmer; "A DC-Balanced, Partioned-Block, 8B/10B Transmission Code"; IBM Journal of Research and Development, International Business Machines Corporation; NewYork, NY, vol. 27, No. 5; Sep. 1, 1983; pp. 440-451; XP000560679.

* cited by examiner

*Primary Examiner* — Jean B Jeanglaude
(74) *Attorney, Agent, or Firm* — Studebaker & Brackett PC (57) ABSTRACT

A circuit arrangement for determining and providing a first information $I_{1-}$, that in a digital input word A B C D E comprising a first input bit A, a second input bit B, a third input bit C, a fourth input bit D and a fifth input bit E, at most only one of the five input bits A, B, C, D, E comprises the value 1 ("high"), a second information $I_2$, that in the input word A B C D E exactly two of the five input bits A, B, C, D, E comprise the value 1 ("high"), a third information $I_3$, that in the input word A B C D E exactly three of the five input bits A, B, C, D, E comprise the value 1 ("high") and a fourth information $I_{4+}$, that in the input word A B C D E at least four of the five input bits A, B, C, D, E comprise the value 1 ("high").

11 Claims, 4 Drawing Sheets

| Name | ABCDE K | Coding Class | Primary abcdei | Alternate abcdei | DR Class | DR | DB Class | DB |
|---|---|---|---|---|---|---|---|---|
| D0 | 00000 0 | L03•D' | 011000 | 100111 | L03•(D+E') | ÷ | | |
| D1 | 10000 0 | L12•D'•E' | 100010 | 011101 | L12•D'•E' | ÷ | | |
| D2 | 01000 0 | L12•D'•E' | 010010 | 101101 | L12•D'•E' | ÷ | | |
| D3 | 11000 0 | L21•D'•E' | 110001 | | | ± | L21•(D'+E') | 0 |
| D4 | 00100 0 | L12•D'•E' | 001010 | 110101 | L12•D'•E' | ÷ | | |
| D5 | 10100 0 | L21•D'•E' | 101001 | | | ± | L21•(D'+E') | 0 |
| D6 | 01100 0 | L21•D'•E' | 011001 | | | ± | L21•(D'+E') | 0 |
| D7 | 11100 0 | | 111000 | 000111 | L30•(D'+E) | − | L30•D'•E' | 0 |
| D8 | 00010 0 | L03•D•E' | 000110 | 111001 | L03•(D+E') | ÷ | | |
| D9 | 10010 0 | L12•(D≠E) | 100101 | | | ± | L12•(D+E)•K' | 0 |
| D10 | 01010 0 | L12•(D≠E) | 010101 | | | ± | L12•(D+E)•K' | 0 |
| D11¹ | 11010 0 | L21•D•E' | 110100 | | | ± | L21•(D'+E') | 0 |
| D12 | 00110 0 | L12•(D≠E) | 001101 | | | ± | L12•(D+E)•K' | 0 |
| D13¹ | 10110 0 | L21•D•E' | 101100 | | | ± | L21•(D'+E') | 0 |
| D14¹ | 01110 0 | L21•D•E' | 011100 | | | ± | L21•(D'+E') | 0 |
| D15 | 11110 0 | L30•D | 101000 | 010111 | L30•D•E' | ÷ | | |
| D16 | 00001 0 | L03•D', L03•D'•E | 011011 | 100100 | L03•D'•E | − | | |
| D17² | 10001 0 | L12•(D≠E) | 100011 | | | ± | L12•(D+E)•K' | 0 |
| D18² | 01001 0 | L12•(D≠E) | 010011 | | | ± | L12•(D+E)•K' | 0 |
| D19 | 11001 0 | | 110010 | | | ± | L21•(D'+E') | 0 |
| D20² | 00101 0 | L12•(D≠E) | 001011 | | | ± | L12•(D+E)•K' | 0 |
| D21 | 10101 0 | | 101010 | | | ± | L21•(D'+E') | 0 |
| D22 | 01101 0 | | 011010 | | | ± | L21•(D'+E') | 0 |
| D/K23 | 11101 x | | 111010 | 000101 | L30•(D'+E) | − | | |
| D24 | 00011 0 | L03•D•E, L03•D | 001100 | 110011 | L03•(D+E') | ÷ | | |
| D25 | 10011 0 | | 100110 | | | ± | L12•(D+E)•K' | 0 |
| D26 | 01011 0 | | 010110 | | | ± | L12•(D+E)•K' | 0 |
| D/K27 | 11011 x | | 110110 | 001001 | L21•D•E | − | | |
| D28 | 00111 0 | | 001110 | | | ± | L12•(D+E)•K' | 0 |
| K28 | 00111 1 | L12•K | 001111 | 110000 | K | − | | |
| D/K29 | 10111 x | | 101110 | 010001 | L21•D•E | − | | |
| D/K30 | 01111 x | | 011110 | 100001 | L21•D•E | − | | |
| D31 | 11111 0 | L30•D, L30•D•E | 101011 | 010100 | L30•(D'+E) | − | | |

Fig. 1A (= Stand der Technik = prior art)

| ABCDE | Primary abcdei | Alternate abcdei |
|---|---|---|
| 00000 | 011000 | 100111 |
| 10000 | 100010 | 011101 |
| 01000 | 010010 | 101101 |
| 11000 | 110001 | |
| 00100 | 001010 | 110101 |
| 10100 | 101001 | |
| 01100 | 011001 | |
| 11100 | 111000 | 000111 |
| 00010 | 000110 | 111001 |
| 10010 | 100101 | |
| 01010 | 010101 | |
| 11010 | 110100 | |
| 00110 | 001101 | |
| 10110 | 101100 | |
| 01110 | 011100 | |
| 11110 | 101000 | 010111 |
| 00001 | 011011 | 100100 |
| 10001 | 100011 | |
| 01001 | 010011 | |
| 11001 | 110010 | |
| 00101 | 001011 | |
| 10101 | 101010 | |
| 01101 | 011010 | |
| 11101 | 111010 | 000101 |
| 00011 | 001100 | 110011 |
| 10011 | 100110 | |
| 01011 | 010110 | |
| 11011 | 110110 | 001001 |
| 00111 | 001110 | |
| 10111 | 101110 | 010001 |
| 01111 | 011110 | 100001 |
| 11111 | 101011 | 010100 |

CIRCUIT ARRANGEMENT, DEVICE AND METHOD FOR 5B/6B CODING

CROSS-REFERENCE TO RELATED APPLICATIONS

This application is a continuation of international (WO) patent application no. PCT/DE2013/200017, filed 27 May 2013, which claims the priority of German (DE) patent application no. 10 2012 104 573.9, filed 25 May 2012, the contents of each being hereby incorporated herein by reference.

FIELD OF THE INVENTION

The present invention principally relates to the technical field of optical and/or electrical, in particular serialised, signal connections; more specifically, the present invention relates to a circuit arrangement provided for five bit/six bit (=5 b/6 b) coding and decoding, an associated coding device as well as corresponding methods.

BACKGROUND OF THE INVENTION

In order to obtain a D[irect]C[urrent]-balanced signal, coding and decoding methods of various bit widths are employed. The method best known is eight bit/ten bit (=8 b/10 b) coding and decoding. 8 b/10 b coding/decoding of this kind in most cases comprises a 5 b/6 b coding/decoding block and a 3 b/4 b coding/decoding block.

Figure 1A:
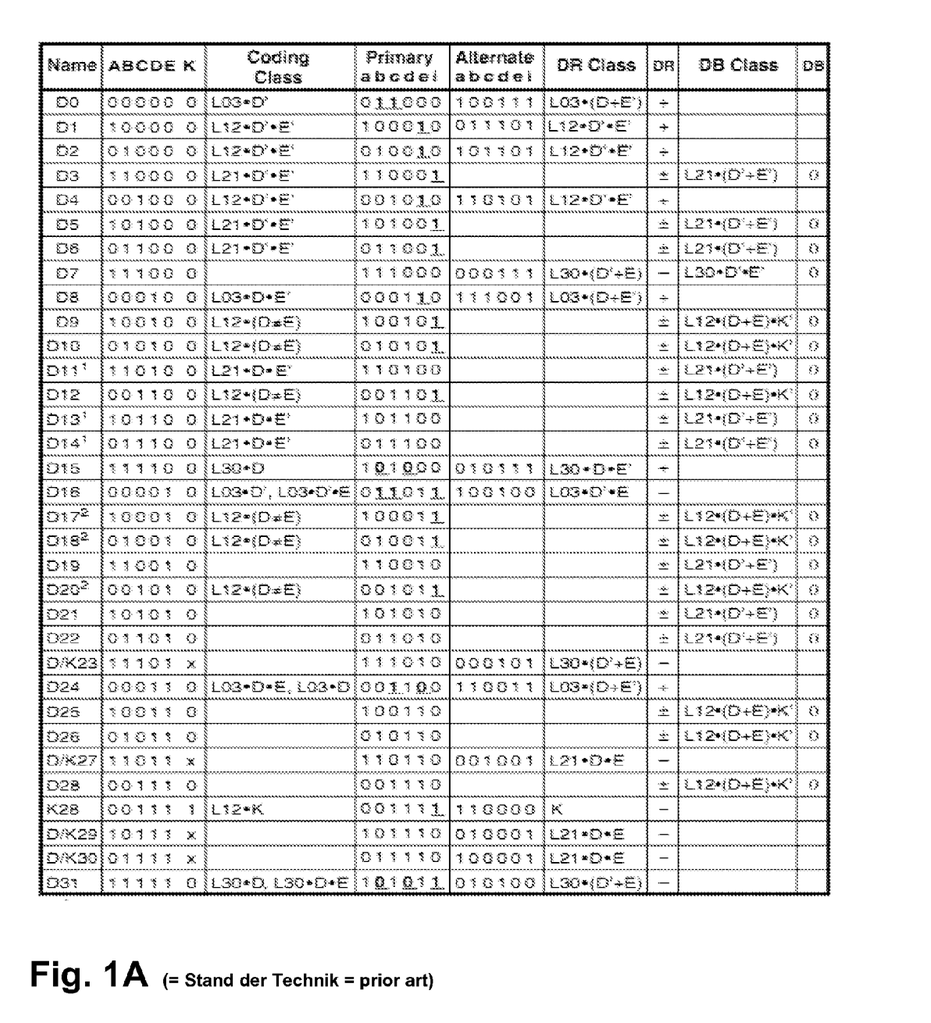
FIG. 1A an exemplary embodiment for an Albert X. Widmer (IBM Research Division) based 5 b/6 b coding table, by means of which five input bits can be converted into six output bits.

The basis used for such 5 b/6 b blocks and for such 3 b/4 b block is, in the main, the instructions and the table by Albert X. Widmer (IBM Research Division). For the technological background we would like to draw your attention, as an example, to the prior art publication U.S. Pat. No. 6,911,921 B2 or the paper "8 B/10B Encoding and Decoding for High Speed Applications" published by Albert X. Widmer (IBM Research Division) on 21 Oct. 2004/3 Nov. 2004. FIG. 1A shows the 5 b/6 b coding table by Widmer.

However, the circuit arrangements mentioned by Widmer and others are usable only up to certain bit rates, depending on the technology used, because with such conventional circuit arrangements the run times of many digital gates connected one behind the other add up. This prevents a high coded data transfer.

OBJECTS AND SUMMARY OF THE INVENTION

Starting from the above-explained disadvantages and inadequacies as well as taking the outlined prior art into account the object of the present invention is to further develop a circuit arrangement provided for five bit/six bit (=5 b/6 b) coding or decoding, an associated coding device as well as corresponding methods in such a way that a high coded data transfer rate is achievable.

This object is achieved by a circuit arrangement according to the invention with the herein described features, by a method according to the invention with the herein described features, by a coding device with the herein described features as well as by a coding method with the herein described features. Advantageous embodiments and expedient further developments of the present invention are described above and below.

This object is achieved by a circuit arrangement for determining and providing a first information $I_{1-}$, that in a digital input word A B C D E comprising a first input bit A, a second input bit B, a third input bit C, a fourth input bit D and a fifth input bit E at most only one of the five input bits A, B, C, D, E comprises the value 1 ("high"), a second information $I_2$, that in the input word A B C D E exactly two of the five input bits A, B, C, D, E comprise the value 1 ("high"), a third information $I_3$, that in the input word A B C D E exactly three of the five input bits A, B, C, D, E comprise the value 1 ("high") and a fourth information $I_{4+}$, that in the input word A B C D E at least four of the five input bits A, B, C, D, E comprise the value 1 ("high"), which circuit arrangement comprises:
a first half-adder
with a first input port,
with a second input port,
with a master output port and
with a transfer output port,
a first full-adder
with a first input port,
with a second input port,
with a transfer input port,
with a master output port and
with a transfer output port,
a second half-adder
with a first input port,
with a second input port,
with a master output port and
with a transfer output port,
a second full-adder
with a first input port,
with a second input port,
with a transfer input port,
with a master output port and
with a transfer output port,
a NOR gate arranged downstream of the two half-adders as well as of the two full-adders
with a first input port,
with a second input port and
with an output port,
a first AND gate arranged downstream of the two half-adders as well as of the two full-adders
with an inverted or negated first input port,
with an inverted or negated second input port,
with a third input port and
with an output port,
a second AND gate arranged downstream of the half-adders as well as of the two full-adders
with an inverted or negated first input port,
with a second input port,
with a third input port and
with an output port as well as
a buffer member arranged downstream of the two half-adders as well as of the two full-adders
with an input port and
with an output port.

This object is further achieved by an embodiment of the circuit arrangement according to the invention,
wherein the first input bit A of the input word A B C D E can be applied to the first input port of the first half-adder,
wherein the second input bit B of the input word A B C D E can be applied to the second input port of the first half-adder,
wherein the third input bit C of the input word A B C D E can be applied to the first input port of the first full-adder, wherein the fourth input bit D of the input word A B C D E can be applied to the second input port of the first full-adder and wherein the fifth input bit E of the input word A B C D E can be applied to the transfer input port of the first full-adder.

This object is further achieved by an embodiment of the circuit arrangement according to the invention, wherein the transfer output port of the first half-adder is connected with the first input port of the second full-adder, wherein the master output port of the first half-adder is connected with the first input port of the second half-adder, wherein the transfer output port of the first full-adder is connected with the second input port of the second full-adder, wherein the master output port of the first full-adder is connected with the second input port of the second half-adder and wherein the transfer output port of the second half-adder is connected with the transfer input port of the second full-adder.

This object is further achieved by an embodiment of the circuit arrangement according to the invention, wherein the transfer output port of the second full-adder is connected with the first input port of the NOR gate, wherein the master output port of the second full-adder is connected with the second input port of the NOR gate and wherein the output port of the NOR gate provides the first information $I_{1-}$.

This object is further achieved by an embodiment of the circuit arrangement according to the invention, wherein the transfer output port of the second full-adder is connected with the inverted or negated first input port of the first AND gate, wherein the master output port of the second half-adder is connected with the inverted or negated second input port of the first AND gate, wherein the master output port of the second full-adder is connected with the third input port of the first AND gate and wherein the output port of the first AND gate provides the second information $I_2$.

This object is further achieved by an embodiment of the circuit arrangement according to the invention, wherein the transfer output port of the second full-adder is connected with the inverted or negated first input port of the second AND gate, wherein the master output port of the second full-adder is connected with the second input port of the second AND gate, wherein the master output port of the second half-adder is connected with the third input port of the second AND gate and wherein the output port of the second AND gate provides the third information $I_3$.

This object is further achieved by an embodiment of the circuit arrangement according to the invention, wherein the transfer output port of the second full-adder is connected with the input port of the buffer member and wherein the output port the buffer member provides the fourth information $I_{4+}$.

This object is further achieved by a method for determining and providing the first information $I_{1-}$, the second information $I_2$, the third information $I_3$ and the fourth information $I_{4+}$ by means of the circuit arrangement.

This object is further achieved by a coding device for encoding the input word A B C D E in a digital output word a b c d e i comprising a first output bit a, a second output bit b, a third output bit c, a fourth output bit d, a fifth output bit e and a sixth output bit i on the basis of the first information $I_{1-}$, the second information $I_2$, the third information $I_3$ and the fourth information $I_{4+}$ provided by the circuit arrangement and/or by the method in accordance with the following coding assignment for the six output bits a, b, c, d, e, is a=A OR Set3;
b=Set1 OR [B AND Set3_negiert];
c=C OR Set1 OR Set3 OR [1 IF ABCDE=00011];
d=D AND Set3_negiert;
e=Set2 OR [E AND (1 IF ABCDE=00011)] OR [1 IF ($I_{1-}$ AND Set1_negiert)];
i=[1 IF ABCDE=11111] OR Set2 OR [1 IF ($I_2$ AND ABCDE=11100)], wherein Set1=(1 IF ABCDE=00000) OR (1 IF ABCDE=00001);
Set1_negiert=(0 IF ABCDE=00000) OR (0 IF ABCDE=00001);
Set2=(1 IF ABCDE=11111) OR (1 IF ABCDE=00001);
Set3=(1 IF ABCDE=11111) OR (1 IF ABCDE=11110);
Set3_negiert=(0 IF ABCDE=11111) OR (0 IF ABCDE=11110).

This object is further achieved by an embodiment of the coding device according to the invention, wherein a missing D[irect]C[urrent] balance or a missing direct current neutrality can be taken into account by means of at least one disparity DISP.

This object is further achieved by an embodiment of the coding device according to the invention, wherein the disparity DISP is given by DISP=[$I_{1-}$ OR $I_{4+}$ OR ABCDE=11100 OR ABCDE=00011] XOR [ABCDE=11100 OR ABCDE=00001 OR ABCDE=11101 OR ABCDE=11011 OR [(A OR B) AND CDE=111]].

This object is further achieved by an embodiment of the coding device according to the invention, wherein the coding device
is arranged downstream of the circuit arrangement and/or
is part of the circuit arrangement and/or
is constructed uniformly and/or in one piece with the circuit arrangement.

This object is further achieved by a coding method for encoding the input word ABCDE into the output word a b c d e i by means of the coding device.

This object is further achieved by a use of the circuit arrangement and/or of the method according to the invention when encoding five bit A, B, C, D, E wide digital signals into six bit a, b, c, d, e, i wide, D[irect]C[urrent]-balanced or direct-current-neutral transferable signals.

This object is further achieved by an embodiment of the use according to the invention in serialised optical and/or electrical signal transfer and/or signal processing.

According to the invention, using a five bit/six bit encoder architecture (5 b/6 b encoder architecture), a D[irect]C[urrent]-balanced optical and/or electrical, in particular serial data connection is provided.

The present invention finally relates to the use of at least one circuit arrangement of the above-mentioned type and/or a method of the above-mentioned type for the coding of five-bit wide digital signals into six-bit wide D[irect]C[urrent] balanced or direct-current-neutral transferable signals, in particular in serialised optical and/or electrical signal transfer and/or signal processing.

BRIEF DESCRIPTION OF THE DRAWINGS

As already discussed above, there are various possibilities for embodying and further developing the teaching of the present invention in an advantageous manner. For this purpose, on the one hand reference is made to the explanations above as well as to the dependent claims, and on the other hand further embodiments, features and advantages of the present invention are explained in greater detail below, inter alia by way of the exemplary embodiment illustrated by FIG. 1B to FIG. 3F.

It is shown in.

Like or similar embodiments, elements or features are provided with identical reference numerals in FIG. 1A to FIG. 3F.

DETAILED DESCRIPTION OF THE INVENTION

By utilising certain circuit arrangements it is possible to achieve a data transfer which is increased when compared to the conventional Widmer 5 b/6 b coding table, for a five bit/six bit coding device (5 b/6 b encoder) according to the present invention, which operates according to the five bit/six bit coding method (5 b/6 b coding method) according to the present invention.

Figure 1B:
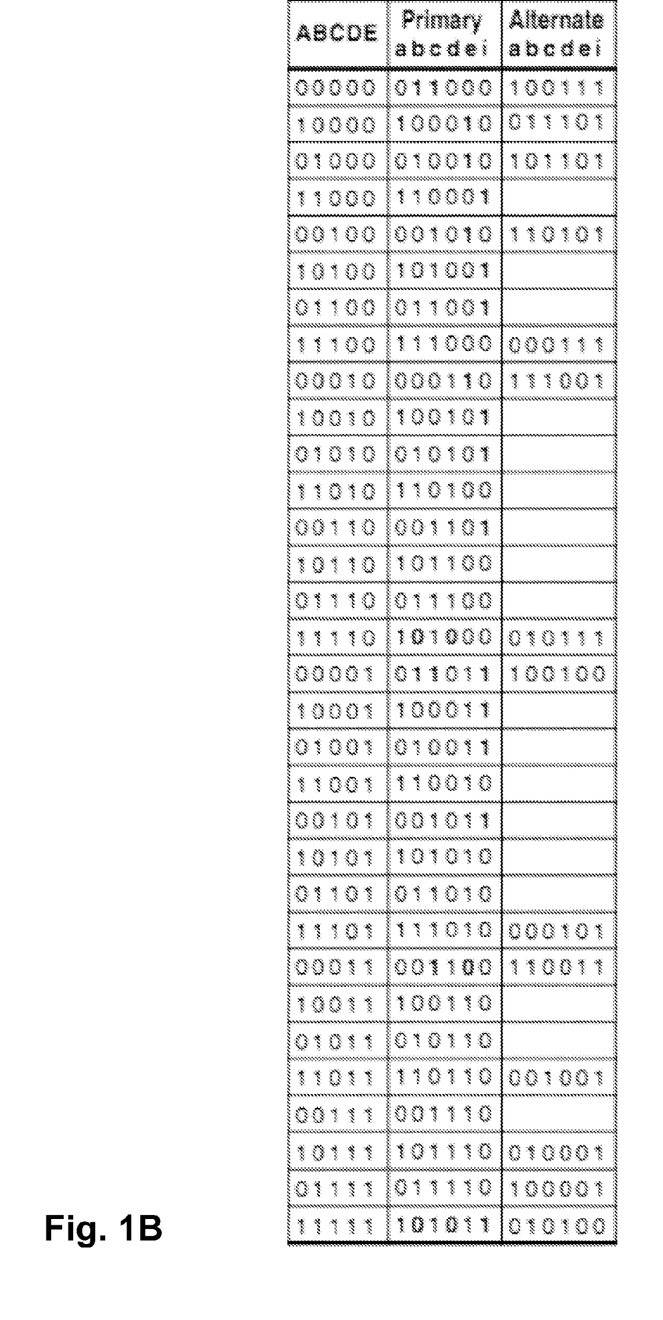
FIG. 1B an exemplary embodiment for an Albert X. Widmer (IBM Research Division) based 5 b/6 b coding table, which has been modified, in particular reduced, by means of which five input bits can be converted into six output bits and which can be put to use in the present invention.

In order to remain compatible with existing 5 b/6 b decoders the Widmer 5 b/6 b coding table of FIG. 1A is, albeit, regarded as a basis for this 5 b/6 b conversion, but it is used in a modified i.e. reduced form according to FIG. 1B, wherein special signs such as K23 or K28 from FIG. 1A are disregarded.

Figure 2:
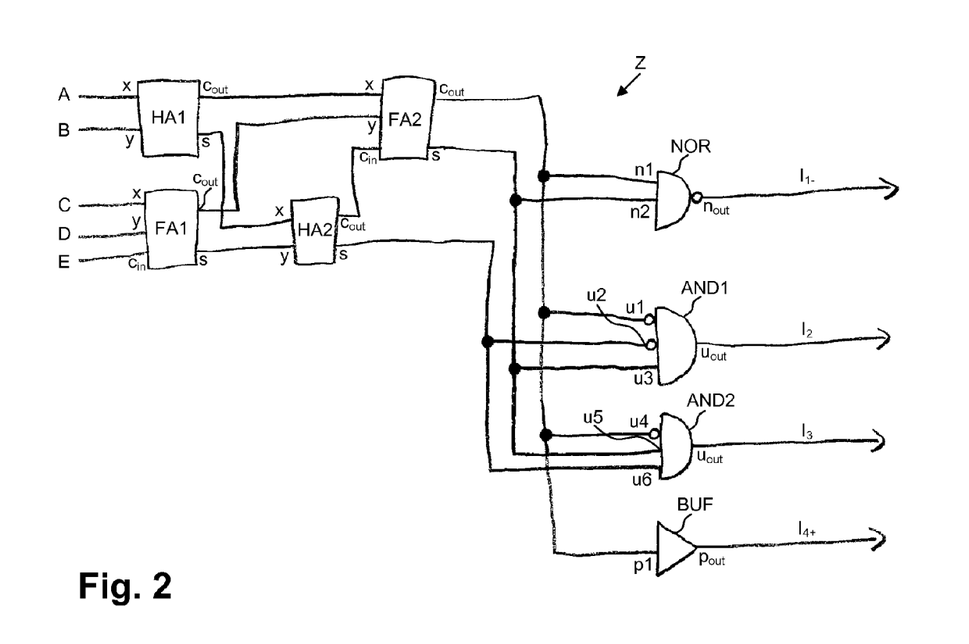
FIG. 2 in a conceptual schematic view an exemplary embodiment for a circuit arrangement according to the present invention which operates according to the method of the present invention.

According to the embodiment shown in in FIG. 2 initially a circuit arrangement Z is used for finding, i.e. for determining the number of zeros and the number of ones in the input word or input code word, wherein the input (code) word is a five-bit-wide digital signal. The circuit arrangement Z thus outputs the number of zeros and the number of ones present in the five-bit-wide input (code) word, wherein the five individual bits of these 5-bit-input (code) words are marked with the letters A B C D E in FIG. 1B and in FIG. 2.

As shown in FIG. 2 the circuit arrangement Z comprises, among others:
a first half-adder HA1
  with a first input port x,
  with a second input port y,
  with a master output connection s and
  with a transfer output port $c_{out}$,
a first full-adder FA1
  with a first input port x,
  with a second input port y,
  with a transfer input port $c_{in}$,
  with a master output port s and
  with a transfer output port $c_{out}$,
a second half-adder HA2
  with a first input port x,
  with a second input port y,
  with a master output port s and
  with a transfer output port $c_{out}$,
a second full-adder FA2
  with a first input port x,
  with a second input port y,
  with a transfer output port $c_{in}$,
  with a master output port s and
  with a transfer output port $c_{out}$.

In this arrangement the half-adder HA1, HA2 is a combinatorial circuit which is normally realised as a digital circuit. Each half-adder HA1, HA2 allows two one-digit binary numbers to be added, wherefore each half-adder HA1, HA2 comprises two inputs x, y. Each half-adder HA1, HA2 comprises two outputs s, $c_{out}$, i.e. a master output s for the result (=digital sum) of the two input signals and a transfer output $c_{out}$ for the transfer or carry of the result according to the following truth table, which illustrates the mode of operation of the half-adder HA1, HA2:

$x=0$, $y=0 \rightarrow s=0$, $c_{out}=0$
$x=0$, $y=1 \rightarrow s=1$, $c_{out}=0$
$x=1$, $y=0 \rightarrow s=1$, $c_{out}=0$
$x=1$, $y=1 \rightarrow s=0$, $c_{out}=1$ With regard to the mathematical function the half-adder HA1, HA2 sets the master output s to 1, as soon as one of the two inputs x, y has a 1. The transfer output $c_{out}$ is set to one only if both inputs x, y have a 1.

The full-adder FA1, FA2 is a combinatorial circuit which is normally realised as a digital circuit. Each full-adder FA1, FA2 allows three one-digit binary numbers to be added, wherefore one of the three inputs x, y, $C_{in}$ is the transfer input $C_{in}$. Each full-adder FA1, FA2 comprises two outputs s, $c_{out}$, i.e. a master output s for the lower-value digit of the result (=of the digital sum) of the three input signals and a transfer output $c_{out}$ for the higher-value digit of the result, i.e. the transfer or carry of the result according to the following truth table, which illustrates the mode of operation of the full-adder FA1, FA2 (the existence of the transfer input $C_{in}$ as well as of the transfer output $c_{out}$ allows overflow treatment in adding networks):

$x=0$, $y=0$, $c_{in}=0 \rightarrow s=0$, $c_{out}=0$
$x=0$, $y=0$, $c_{in}=1 \rightarrow s=1$, $c_{out}=0$
$x=0$, $y=1$, $c_{in}=0 \rightarrow s=1$, $c_{out}=0$
$x=1$, $y=0$, $c_{in}=0 \rightarrow s=1$, $c_{out}=0$
$x=0$, $y=1$, $c_{in}=1 \rightarrow s=0$, $c_{out}=1$
$x=1$, $y=0$, $c_{in}=1 \rightarrow s=0$, $c_{out}=1$ x=1, y=1, $c_{in}$=0→s=0, $c_{out}$=1
x=1, y=1, $c_{in}$=1→s=1, $c_{out}$=1

With regard to the mathematical function the full-adder FA1, FA2 sets the master output s to 1, as soon as one of the three inputs x, y, $C_{in}$ has a 1. If two of the three inputs x, y, $C_{in}$ have a 1, the transfer output $c_{out}$ is set to 1. If all three inputs x, y, $C_{in}$ have a 1, both outputs s and $c_{out}$, i.e. both the master output s and the transfer output $C_{out}$ are set to 1.

According to FIG. 2 the first bit A of the 5-bit input (code) word A B C D E is applied to the first input x of the first half-adder HA1. The second bit B of the 5-bit input (code) word A B C D E is applied to the second input y of the first half-adder HA1.

Since the transfer output $c_{out}$ of the first half-adder HA1 is connected with the first input x of the second full-adder FA2, the transfer output signal of the first half-adder HA1 is applied to the first input x of the second full-adder FA2.

Since the master output s of the first half-adder HA1 is connected with the first input x of the second full-adder FA2, the master output signal of the first half-adder HA1 is applied to the first input x of the second half-adder HA2.

The third bit C of the 5-bit input (code) word A B C D E is applied to the first input x of the first full-adder FA1. The fourth bit D of the 5-bit input (code) A B C D E is applied to the second input y of the first full-adder FA1. The fifth (last) bit E of the 5-bit input (code) word A B C D E is applied to the transfer input $C_{in}$ of the first full-adder FA1.

Since the transfer output $c_{out}$ of the first full-adder FA1 is connected with the second input y of the second full-adder FA2, the transfer output signal of the first full-adder FA1 is applied to the second input y of the second full-adder FA2.

Since the master output s of the first full-adder FA1 is connected with the second input y of the second half-adder HA2, the master output signal of the first full-adder FA1 is applied to the second input y of the second half-adder HA2.

Since the transfer output $c_{out}$ of the second half-adder HA2 is connected with the transfer input $C_{in}$ of the second full-adder FA2, the transfer output signal of the second half-adder HA2 is applied to the transfer input $C_{in}$ of the second full-adder FA2.

As can further be seen in FIG. 2, the circuit arrangement Z comprises, among others:
 a NOR gate or NOR member NOR arranged downstream of the two half-adders HA1, HA2 as well as of the two full-adders FA1, FA2
  with a first input port n1,
  with a second input port n2 and
  with an output port $n_{out}$,
 a first AND gate or AND member AND1 arranged downstream of the two half-adders HA1, HA2 as well as of the two full-adders FA1, FA2
  with an inverted or negated first input port u1,
  with an inverted or negated second input port u2,
  with a third input port u3 and
  with an output port $u_{out}$,
 a second AND gate or AND member AND2 arranged downstream of the two half-adders HA1, HA2 as well as of the two full-adders FA1, FA2
  with an inverted or negated first input port u4,
  with a second input port u5,
  with a third input port u6 and
  with an output port $u_{out}$ as well as
 a buffer member BUF provided for example for runtime compensation, arranged downstream of the two half-adders HA1, HA2 as well as of the two full-adders FA1, FA2
  with an input port $p_{in}$ and
  with an output $p_{out}$.

This NOR gate or NOR member (=defined as an OR gate or OR member with inverted or negated output), these two AND gates or AND members AND1, AND2 as well as this buffer member BUF are arranged downstream of the two half-adders HA1, HA2 as well as of the two full-adders FA1, FA2 as follows:

Since the transfer output $c_{out}$ of the second full-adder FA2 is connected with the first input n1 of the NOR member, the transfer output signal of the second full-adder FA2 is applied to the first input n1 of the NOR member. Since the master output s of the second full-adder FA2 is connected with the second input n2 of the NOR member, the master signal of the second full-adder FA2 is applied to the second input n2 of the NOR member. The output $n_{out}$ of the NOR member supplies the information $I_{1-}$, that there is a one (=1) or less than a one (=1), in other words at most a one (=1) in the five-bit wide input (code) word A B C D E.

Since the transfer output $c_{out}$ of the second full-adder FA2 is connected with the first input u1 of the first AND member AND1, the transfer output signal of the second full-adder FA2 is applied to the inverted or negated first input u1 of the first AND member AND1. Since the master output s of the second half-adder HA2 is connected with the inverted or negated second input u2 of the first AND member AND1, the master signal of the second half-adder HA2 is applied to the inverted or negated second input u2 of the first AND member AND1. Since the master output s of the second full-adder FA2 is connected with the third input u3 of the first AND member AND1, the master signal of the second full-adder FA2 is applied to the third input u3 of the first AND member AND1. The output $u_{out}$ of the first AND member AND1 supplies the information $I_2$, that there are two ones (=1) in the five-bit wide input (code) word A B C D E.

Since the transfer output $c_{out}$ of the second full-adder FA2 is connected with the inverted or negated first input u4 of the second AND member AND2, the transfer output signal of the second full-adder FA is applied to the inverted or negated first input u4 of the second AND member AND2. Since the master output s of the second full-adder FA2 is connected with the second input u5 of the second AND member AND2, the master signal of the second full-adder FA2 is applied to the second input u5 of the second AND member AND2. Since the maser output s of the second half-Adder HA2 is connected with the third input u6 of the second AND member AND2, the master signal of the second half-adder HA2 is applied to the third input u6 of the second AND member AND2. The output $u_{out}$ of the second AND member AND2 supplies the information $I_3$, that there are three ones (=1) in the five-bit wide input (code) word A B C D E.

Since the transfer output $c_{out}$ of the second full-adder FA2 is connected with the input $p_{in}$ of the buffer member BUF, the transfer output signal of the second full-adder FA2 is applied to the input $p_{in}$ of the buffer member BUF. The output $p_{out}$ of the buffer member BUF supplies the information $I_{4+}$, that there are four ones (=1) or more than four ones (=1), in other words at least four ones (=1), in the five-bit wide input (code) word A B C D E.

The 32 5-bit input (code) words A B C D E are converted into 6-bit output words with the letters a, b, c, d, e i by means of the coding algorithm for the 5 b/6 b coding device according to the present invention, wherein in FIG. 1B the six individual bits of the 6-bit output words are marked with the letters a, b, c, d, e, i.

To this end, as illustrated in the form of the coding scheme below, which is illustrated in FIG. 3A to FIG. 3F, the 5 b/6 b coding device according to the present invention and the 5 b/6 b coding method according to the present invention access the information $I_{1-}$, information $I_2$, information $I_3$, information $I_{4+}$ provided by the circuit arrangement Z according to the present invention, wherein the circuit arrangement Z

- may be arranged upstream of the 5 b/6 b coding device and/or
- may be part of the 5 b/6 b coding device and/or
- may be constructed uniformly and/or in one piece with the 5 b/6 b coding device.

Figure 3A:
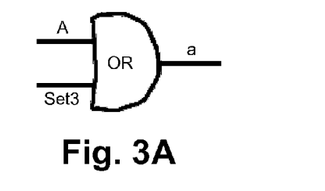
FIG. 3A in a conceptual schematic view an exemplary embodiment for a first component of a 5 b/6 b coding device according to the present invention which operates according to the coding method of the present invention.

In essence the 5 b/6 b coding method according to the present invention thus depicts incoming 5-bit words A B C D E via the exemplary coding table shown in FIG. 1B in the form of outgoing primary 6-bit symbols a b c d e i (=primary a b c d e i) as follows:

a=A OR Set3.

Figure 3B:
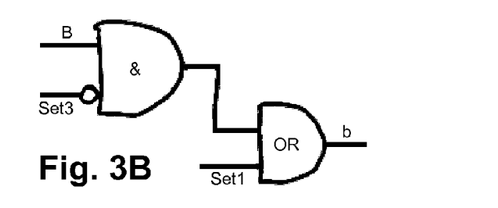
FIG. 3B in a conceptual schematic view an exemplary embodiment for a second component of a 5 b/6 b coding device according to the present invention which operates according to the coding method of the present invention.

This coding instruction for the first bit a of the output symbol a b c d e i may be realised by means of logical switching elements shown by way of example in FIG. 3A, which may represent a first component of the five bit/six bit coding device (5 b/6 b-coding device) according to the present invention.

b=Set1 OR [B AND Set3_negiert].

Figure 3C:
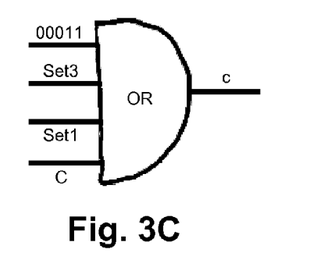
FIG. 3C in a conceptual schematic view an exemplary embodiment for a third component of a 5 b/6 b coding device according to the present invention which operates according to the coding method of the present invention.

This coding instruction for the second bit b of the output symbol a b c d e i may be realised by means of logical switching elements shown by way of example in FIG. 3B, which may represent a second component of the five bit/six bit coding device (5 b/6 b-coding device) according to the present invention.

c=C OR Set1 OR Set3 OR [1 IF ABCDE=00011].

Figure 3D:
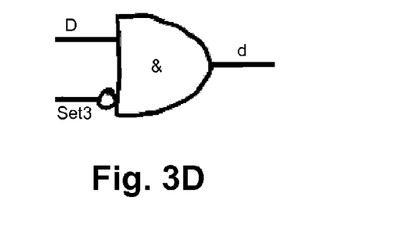
FIG. 3D in a conceptual schematic view an exemplary embodiment for a fourth component of a 5 b/6 b coding device according to the present invention which operates according to the coding method of the present invention.

This coding instruction for the third bit c of the output symbol a b c d e i may be realised by means of logical switching elements shown by way of example in FIG. 3C, which may represent a third component of the five bit/six bit coding device (5 b/6 b-coding device) according to the present invention.

d=D AND Set3_negiert.

Figure 3E:
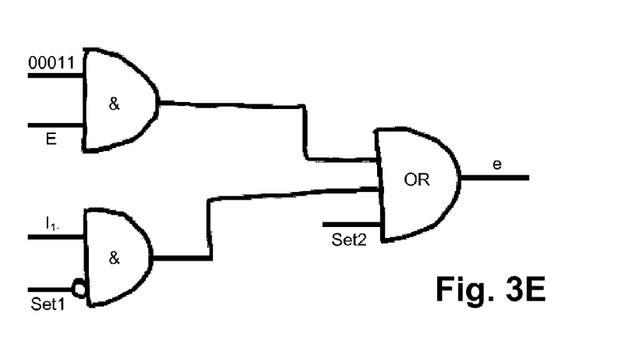
FIG. 3E in a conceptual schematic view an exemplary embodiment for a fifth component of a 5 b/6 b coding device according to the present invention which operates according to the coding method of the present invention.

This coding instruction for the fourth bit d of the output symbol a b c d e i may be realised by means of logical switching elements shown by way of example in FIG. 3D, which may represent a fourth component of the five bit/six bit coding device (5 b/6 b-coding device) according to the present invention.

e=Set2 OR [E AND (1 IF ABCDE=00011)] OR [1 IF ($I_{1-}$ AND Set1_negiert)].

Figure 3F:
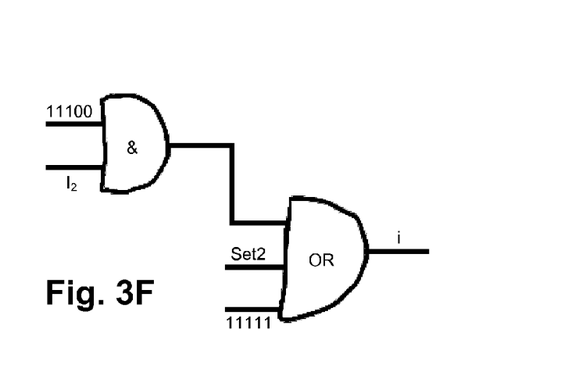
FIG. 3F in a conceptual schematic view an exemplary embodiment for a sixth component of a 5 b/6 b coding device according to the present invention which operates according to the coding method of the present invention.

This coding instruction for the fifth bit e of the output symbol a b c d e i may be realised by means of logical switching elements shown by way of example in FIG. 3E, which may represent a fifth component of the five bit/six bit coding device (5 b/6 b-coding device) according to the present invention.

i=[1 IF ABCDE=11111] OR Set2 OR [1 IF ($I_2$ AND ABCDE=11100)].

This coding instruction for the sixth bit a of the output symbol a b c d e i may be realised by means of logical switching elements shown by way of example in FIG. 3F, which may represent a sixth component of the five bit/six bit coding device (5 b/6 b-coding device) according to the present invention.

In this arrangement

Set1=(1 IF ABCDE=00000) OR (1 IF ABCDE=00001), and therefore

Set1_negiert=(0 IF ABCDE=00000) OR (0 IF ABCDE=00001);

Set2=(1 IF ABCDE=11111) OR (1 IF ABCDE=00001);

Set3=(1 IF ABCDE=11111) OR (1 IF ABCDE=11110), and therefore

Set3_negiert=(0 IF ABCDE=11111) OR (0 IF ABCDE=11110), wherein

Set1_negiert may also be called Set1_invertiert and Set3_negiert may also be called Set3_invertiert.

Using this primary coding algorithm for the 5 b/6 b-encoder according to the present invention, of the 32 input (code) words A B C D E to be transferred, a part is converted into the 6-bit output symbols or output words a b c d e i, which contain an identical number of zeros and ones, i.e. respectively three zeros and three ones, and which, as a result, can be balanced or D[irect]C[urrent] balanced or D[irect]C[urrent] neutral, i.e. can be transferred in a direct-current-neutral manner.

Therefore, as an example, according to the coding table in FIG. 1B nineteen of the 32 5-bit input (code) words ABCDE to be transferred are converted into 6-bit output symbols a b c d e i which are transferable in a direct-current-neutral manner.

The remain part of the 32 5-bit input (code) words ABCDE to be transferred are converted into 6-bit output symbols abode i, which do not contain an identical number of zeros and ones but

- either four zeros and two ones
- or two zeros and four ones and are therefore called unbalanced or D[irect]C[urrent] unbalanced or not D[irect]C[urrent] neutral, i.e. taken on their own, would not be transferable in a direct-current-neutral manner.

Therefore, as an example, according to the coding table in FIG. 1B, thirteen of the 32 5-bit input (code) words ABCDE to be transferred are converted into 6-bit output symbols a b c d e i which are transferable in a manner which is not direct-current-neutral. Thus there are two possible output symbols or output words, i.e. primary a b c d e i and alternate a b c d e i according to FIG. 1B for these thirteen input symbols A B C D E.

Whether

- the first or primary output symbol or output (code) word, i.e. primary a b c d e i, or
- the second or alternative output symbol or output (code) word, i.e. alternate a b c d e i (=inverse or negation of the respective primary a b c d e i according to FIG. 1B), is used, depends on the respectively previously sent unbalanced output symbol.

With regard to the second or alternative output symbol or output (code) word alternate a b c d e i the disparity DISP is taken into account which is formed as follows:

DISP=[$I_{1-}$ OR $I_{4+}$ OR ABCDE=11100 OR ABCDE=00011] XOR [ABCDE=11100 OR ABCDE=00001 OR ABCDE=11101 OR ABCDE=11011 OR [(A OR B) AND CDE=111]].

From a circuit-technical point of view the XOR-instruction can be realised for example by an [e]X[clusive]OR gate or [e]X[clusive]OR member.

Depending on the result of this ascertained disparity DISP either the first or primary output symbol or output (code) word (=primary a b c d e i)

or the second or alternative output symbol or output (code) word (=alternate a b c d e i)

is selected and used, in order to compensate for or balance the missing D[irect]C[urrent] balance or missing direct current neutrality.

By using the above-described coding algorithm for the 5 b/6 b encoder according to the present invention it is possible to achieve a higher coded data transfer than with conventional solutions.

LIST OF REFERENCE NUMERALS a first bit of the output code word or output word a b c d e i A first input bit or input code word or input word A B C D E AND1 first AND gate or first AND member
AND2 second AND gate or second AND member
b second input bit of the output code word or output word a b c d e i
B second input bit of the input code word or input word A B C D E
BUF buffer member
c third output bit of the output code word or output word a b c d e i
C third input bit of the input code word or input word A B C D E
$c_{in}$ third input port or transfer input port of the full-adder FA1, FA2
$c_{out}$ transfer output port of the full-adder FA1, FA2 or the half-adder HA1, HA2
d fourth output bit of the output code word or output word a b c d e i
D fourth input bit of the input code word or input word A B C D E
DISP disparity
e fifth output bit of the output code word or output word a b c d e i
E fifth or last input bit of the input code word or input word A B C D E
FA1 first full-adder
FA2 second full-adder
HA1 first half-adder
HA2 second half-adder
i sixth or last output bit of the output code word or output word a b c d e i
$I_{1-}$ first information, that there is one one or no one in the input code word or input word A B C D E
$I_2$ second information, that there are two ones in the input code word or input word A B C D E
$I_3$ third information, that there are three ones in the input code word or input word A B C D E
$I_{4+}$ fourth information, that there are four ones or five ones in the input code word or input word A B C D E
NOR NOR gate or NOR member
$n_{out}$ output port of the NOR gate or NOR member NOR
n1 first input port of the NOR gate or NOR member NOR
n2 second input port of the NOR gate or NOR member NOR
$p_{in}$ input port of the buffer member BUF
$p_{out}$ output port of the buffer member BUF
s master output port of the full-adder FA1, FA2 or the half-adder HA1, HA2
u1 inverted or negated first input port of the first AND gate or AND member AND1
u2 inverted or negated second input port of the first AND gate or AND member AND1
u3 third input port of the first AND gate or AND member AND1
u4 inverted or negated first input port of the second AND gate or AND member AND2
u5 second input port of the second AND gate or AND member AND2
u6 third input port of the second AND gate or AND member AND2
$u_{out}$ output port of the first AND gate or AND member AND1 or of the second AND gate or AND member AND2
x first input port of the full-adder FA1, FA2 or of the half-adder HA1, HA2
y second input port of the full-adder FA1, FA2 or of the half-adder HA1, HA2
Z circuit arrangement While this invention has been described as having a preferred design, it is understood that it is capable of further modifications, and uses and/or adaptations of the invention and following in general the principle of the invention and including such departures from the present disclosure as come within the known or customary practice in the art to which the invention pertains, and as may be applied to the central features hereinbefore set forth, and fall within the scope of the invention.

What is claimed is:

1. A circuit arrangement for determining and providing
a first information $I_{1-}$, that in a digital input word A B C D E comprising a first input bit A, a second input bit B, a third input bit C, a fourth input bit D and a fifth input bit E at most only one of the five input bits A, B, C, D, E comprises the value 1 ("high"),
a second information $I_2$, that in the input word A B C D E exactly two of the five input bits A, B, C, D, E comprise the value 1 ("high"),
a third information $I_3$, that in the input word A B C D E exactly three of the five input bits A, B, C, D, E comprise the value 1 ("high") and
a fourth information $I_{4+}$, that in the input word A B C D E at least four of the five input bits A, B, C, D, E comprise the value 1 ("high"),
which circuit arrangement comprises:
a first half-adder
with a first input port,
with a second input port,
with a master output port and
with a transfer output port,
a first full-adder
with a first input port,
with a second input port,
with a transfer input port,
with a master output port and
with a transfer output port,
a second half-adder
with a first input port,
with a second input port,
with a master output port and
with a transfer output port,
a second full-adder
with a first input port,
with a second input port,
with a transfer input port,
with a master output port and
with a transfer output port,
a NOR gate arranged downstream of the two half-adders as well as of the two full-adders
with a first input port,
with a second input port and
with an output port,
a first AND gate arranged downstream of the two half-adders as well as of the two full-adders
with an inverted or negated first input port,
with an inverted or negated second input port,
with a third input port and
with an output port,
a second AND gate arranged downstream of the half-adders as well as of the two full-adders
with an inverted or negated first input port,
with a second input port,
with a third input port and
with an output port as well as
a buffer member arranged downstream of the two half-adders as well as of the two full-adders with an input port and
with an output port.

2. The circuit arrangement according to claim 1,
wherein the first input bit A of the input word A B C D E can be applied to the first input port of the first half-adder,
wherein the second input bit B of the input word A B C D E can be applied to the second input port of the first half-adder,
wherein the third input bit C of the input word A B C D E can be applied to the first input port of the first full-adder,
wherein the fourth input bit D of the input word AB C D E can be applied to the second input port of the first full-adder and
wherein the fifth input bit E of the input word A B C D E can be applied to the transfer input port of the first full-adder.

3. The circuit arrangement according to claim 1,
wherein the transfer output port of the first half-adder is connected with the first input port of the second full-adder,
wherein the master output port of the first half-adder is connected with the first input port of the second half-adder,
wherein the transfer output port of the first full-adder is connected with the second input port of the second full-adder,
wherein the master output port of the first full-adder is connected with the second input port of the second half-adder and
wherein the transfer output port of the second half-adder is connected with the transfer input port of the second full-adder.

4. The circuit arrangement according to claim 1,
wherein the transfer output port of the second full-adder is connected with the first input port of the NOR gate,
wherein the master output port of the second full-adder is connected with the second input port of the NOR gate and
wherein the output port of the NOR gate provides the first information $I_{1-}$.

5. The circuit arrangement according to claim 1,
wherein the transfer output port of the second full-adder is connected with the inverted or negated first input port of the first AND gate,
wherein the master output port of the second half-adder is connected with the inverted or negated second input port of the first AND gate,
wherein the master output port of the second full-adder is connected with the third input port of the first AND gate and
wherein the output port of the first AND gate provides the second information $I_2$.

6. The circuit arrangement according to claim 1,
wherein the transfer output port of the second full-adder is connected with the inverted or negated first input port of the second AND gate,
wherein the master output port of the second full-adder is connected with the second input port of the second AND gate,
wherein the master output port of the second half-adder is connected with the third input port of the second AND gate and
wherein the output port of the second AND gate provides the third information $I_3$.

7. The circuit arrangement according to claim 1,
wherein the transfer output port of the second full-adder is connected with the input port of the buffer member and
wherein the output port the buffer member provides the fourth information $I_{4+}$.

8. A coding device for encoding the input word AB C D E in a digital output word a b c d e i comprising a first output bit a, a second output bit b, a third output bit c, a fourth output bit d, a fifth output bit e and a sixth output bit i on the basis of the first information $I_{1-}$, the second information $I_2$, the third information $I_3$ and the fourth information $I_{4+}$ provided by at least one circuit arrangement according to claim 1 in accordance with the following coding assignment for the six output bits a, b, c, d, e, i:
a=A OR Set3;
b=Set1 OR [B AND Set3_negiert];
c=C OR Set1 OR Set3 OR [1 IF ABCDE=00011];
d=D AND Set3_negiert;
e=Set2 OR [E AND (1 IF ABCDE=00011)] OR [1 IF (I1–AND Set1_negiert)];
i=[1 IF ABCDE=11111] OR Set2 OR [1 IF (I2 AND ABCDE=11100)],
wherein Set1=(1 IF ABCDE=00000) OR (1 IF ABCDE=00001);
Set1_negiert=(0 IF ABCDE=00000) OR (0 IF ABCDE=00001);
Set2=(1 IF ABCDE=11111) OR (1 IF ABCDE=00001);
Set3=(1 IF ABCDE=11111) OR (1 IF ABCDE=11110);
Set3_negiert=(0 IF ABCDE=11111) OR (0 IF ABCDE=11110).

9. The coding device according to claim 8, wherein the coding device
is arranged downstream of the circuit arrangement or
is part of the circuit arrangement or
is constructed uniformly or in one piece with the circuit arrangement.

10. The coding device according to claim 9, wherein a missing D[irect]C[urrent] balance or a missing direct current neutrality can be taken into account by means of at least one disparity DISP.

11. The coding device according to claim 10, wherein the disparity DISP is given by DISP=[$I_{1-}$ OR $I_{4+}$ OR ABCDE=11100 OR ABCDE=00011] XOR [ABCDE=11100 OR ABCDE=00001 OR ABCDE=11101 OR ABCDE=11011 OR [(A OR B) AND CDE=111]].

* * * * *